(12) United States Patent
Ivanov et al.

(10) Patent No.: US 7,772,648 B1
(45) Date of Patent: Aug. 10, 2010

(54) PERFORMANCE ENHANCED SILICON-ON-INSULATOR TECHNOLOGY

(75) Inventors: Tony Ivanov, Summerfield, NC (US); Julio Costa, Summerfield, NC (US); Michael Carroll, Jamestown, NC (US); Thomas Gregory McKay, Boulder Creek, CA (US); Christian Rye Iversen, Vestbjerg (DK)

(73) Assignee: RF Micro Devices, Inc., Greensboro, NC (US)

( * ) Notice: Subject to any disclaimer, the term of this patent is extended or adjusted under 35 U.S.C. 154(b) by 38 days.

(21) Appl. No.: 11/854,068

(22) Filed: Sep. 12, 2007

Related U.S. Application Data (60) Provisional application No. 60/825,451, filed on Sep. 13, 2006.

(51) Int. Cl.
*H01L 29/72* (2006.01)
(52) U.S. Cl. .......... 257/349; 257/347; 257/350; 257/353; 257/401; 257/507; 257/644
(58) Field of Classification Search .......... 257/347, 257/349, 350, 353, 401, 507, 544
See application file for complete search history.

(56) References Cited

U.S. PATENT DOCUMENTS 5,773,151 A * 6/1998 Begley et al. .......... 428/446
6,355,537 B1 * 3/2002 Seefeldt .......... 438/405
2008/0188045 A1 * 8/2008 Morris .......... 438/217

OTHER PUBLICATIONS

Kelly, Dylan et al., "The State-of-the-Art of Silicon-on-Sapphire CMOS RF Switches," CSIC 2005 Digest, 2005, pp. 200-203, IEEE.
Tinella, Carlo et al., "A 0.7dB Insertion Loss CMOS—SOI Antenna Switch with more than 50dB Isolation over the 2.5 to 5GHz Band," Proceedings of the 28th European Solid-State Circuits Conference 2002, Sep. 24-26, 2002, pp. 483-486.

* cited by examiner

*Primary Examiner*—Edward Wojciechowicz
(74) *Attorney, Agent, or Firm*—Withrow & Terranova, P.L.L.C.

(57) ABSTRACT

The present invention includes a silicon-on-insulator (SOI) wafer that enhances certain performance parameters by increasing silicon device layer and insulator layer thicknesses and increasing silicon handle wafer resistivity. By increasing the silicon device layer thickness, effects of the floating body problem may be significantly reduced. By increasing the insulator layer thickness and the silicon handle wafer resistivity, influences from the silicon handle wafer on devices formed using the silicon device layer may be significantly reduced. As a result, standard tools, methods, and processes may be used.

18 Claims, 7 Drawing Sheets

PERFORMANCE ENHANCED SILICON-ON-INSULATOR TECHNOLOGY

This application claims the benefit of provisional patent application Ser. No. 60/825,451, filed Sep. 13, 2006, the disclosure of which is incorporated herein by reference in its entirety.

FIELD OF THE INVENTION

The present invention relates to silicon-on-insulator semiconductor technology used to manufacture integrated circuits, which may be used in radio frequency (RF) communications circuitry.

BACKGROUND OF THE INVENTION

Silicon integrated circuit (IC) technologies have evolved significantly to provide high levels of integration, reduced sizes and costs, improved yields and reliability, and sophisticated tools for design, simulation, production, and testing; however, standard Silicon IC technologies have limitations in terms of operating voltages, frequencies, and power levels. Therefore, a number of applications, such as RF switches, RF amplifiers, and other RF circuitry, use other IC technologies, such as Gallium Arsenide, to overcome the limitations of Silicon. Some RF switch designs use multiple RF switches coupled in series to increase voltage ratings and improve linearity during both an ON state and an OFF state; however, each RF switch needs to be isolated from the other RF switches. Traditional silicon processes may have substrate P-N or N-P junctions between a substrate of a wafer and devices, such as RF switches, formed adjacent to the substrate; therefore, RF switch isolation may not be possible.

Figure 1:
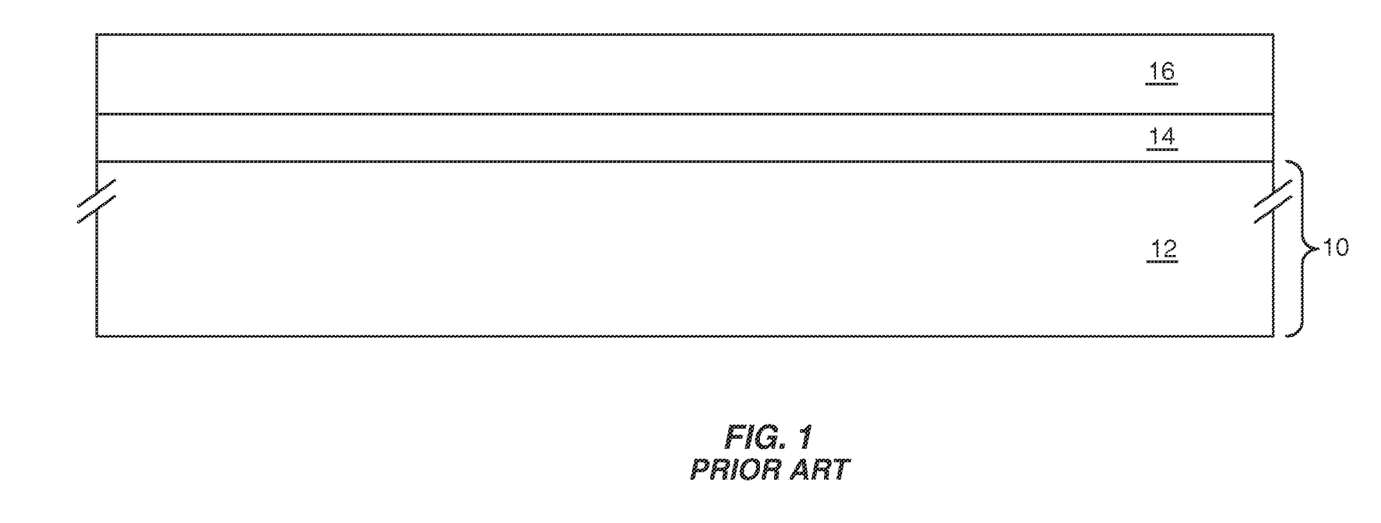
FIG. 1 shows a silicon-on-insulator wafer according to the prior art.

A Silicon technology that may provide device isolation is silicon-on-insulator (SOI) technology, as illustrated in FIG. 1 according to the prior art. A silicon handle wafer section 10 provides a substrate 12. An insulator layer 14 is formed over the substrate 12, and a silicon device layer 16 is formed over the insulator layer 14. The insulator layer 14 is typically of a non-conducting material, such as Silicon Dioxide, to electrically isolate the silicon device layer 16 from the substrate 12; therefore, multiple isolated devices may be formed on a single Silicon wafer. However, SOI technology has its own limitations. By isolating individual devices, a problem called the floating body effect may occur. Each isolated device may have a bias voltage applied to its body to remove excess carriers from the P-N junction regions; however, if operating voltages are high enough, the depletion regions between the drain and the source may reach the insulator layer 14 and introduce non-linearities and other anomalies. As a result, special design, simulation, fabrication, and testing tools, methods, and processes may be required.

Thus, there is a need for a Silicon technology that can provide the advantages of Silicon, including many different types of components, low costs, small sizes, improved yields and reliability, and which uses standard tools, methods, and processes, and can overcome the shortcomings of Silicon technology by solving the floating body problem and meeting the operating voltage, operating frequency, and linearity requirements of RF applications.

SUMMARY OF THE INVENTION

The present invention includes a silicon-on-insulator (SOI) wafer that enhances certain performance parameters by increasing silicon device layer and insulator layer thicknesses and increasing silicon handle wafer resistivity. By increasing the silicon device layer thickness, effects of the floating body problem may be significantly reduced. By increasing the insulator layer thickness and the silicon handle wafer resistivity, influences from the silicon handle wafer on devices formed using the silicon device layer may be significantly reduced. As a result, standard tools, methods, and processes may be used.

In one embodiment of the present invention, oxide-filled deep trenches may be used to isolate multiple silicon devices from each other. Metal oxide semiconductor (MOS) devices, complementary MOS (CMOS) devices, analog devices, RF devices, or any combination thereof, may be integrated using a single SOI wafer. The MOS or CMOS devices may include, but are not limited to, digital control circuits, power management circuits, computer processing circuits, memory circuits, switching power converters, baseband control circuits, and the like. The RF devices may include, but are not limited to, RF amplifier circuitry, RF power amplifier circuitry, RF switches, multiple RF switches coupled in series, mixers, frequency synthesizers, and the like.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention includes a silicon-on-insulator (SOI) wafer that enhances certain performance parameters by increasing silicon device layer and insulator layer thicknesses and increasing silicon handle wafer resistivity. By increasing the silicon device layer thickness, effects of the floating body problem may be significantly reduced. By increasing the insulator layer thickness and the silicon handle wafer resistivity, influences from the silicon handle wafer on devices formed using the silicon device layer may be significantly reduced. As a result, standard tools, methods, and processes may be used.

In one embodiment of the present invention, oxide-filled deep trenches may be used to isolate multiple silicon devices from each other. Metal oxide semiconductor (MOS) devices, complementary MOS (CMOS) devices, analog devices, RF devices, or any combination thereof, may be integrated using a single SOI wafer. The MOS or CMOS devices may include, but are not limited to, digital control circuits, power management circuits, computer processing circuits, memory circuits, switching power converters, baseband control circuits, and the like. The RF devices may include, but are not limited to, RF amplifier circuitry, RF power amplifier circuitry, RF switches, multiple RF switches coupled in series, mixers, frequency synthesizers, and the like.

FIG. 1 shows an SOI wafer according to the prior art. The silicon handle wafer section 10 of the SOI wafer may have a resistivity ranging from 1 ohm•centimeter to 10 ohm•centimeters. The insulator layer 14 typically has a thickness less than 400 nanometers, and the silicon device layer 16 may have a thickness of approximately 300 nanometers.

Figure 2:
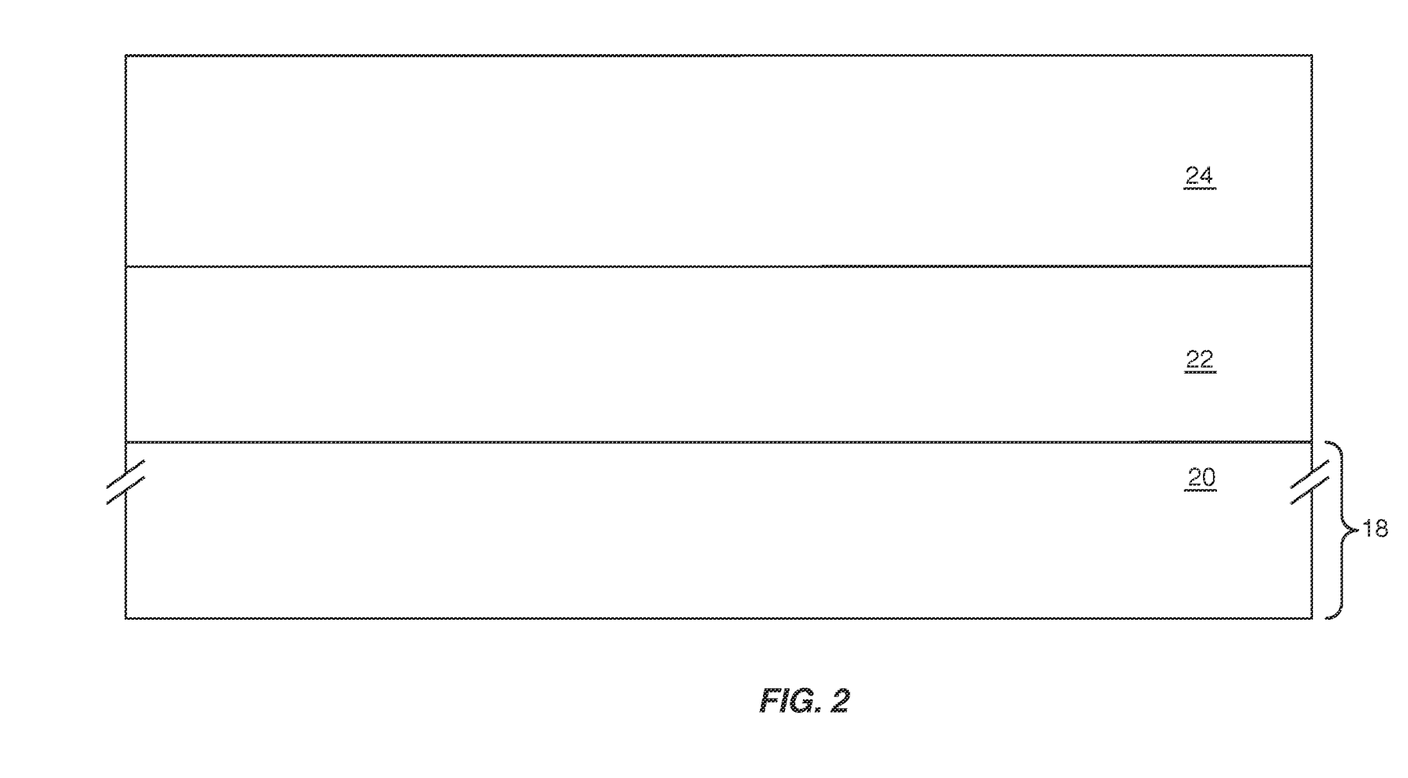
FIG. 2 shows a performance enhanced silicon-on-insulator wafer, according to one embodiment of the present invention.

FIG. 2 shows a performance enhanced SOI wafer, according to one embodiment of the present invention. The enhanced SOI wafer has an SOI handle wafer section 18, which provides an SOI substrate 20, and may have an SOI handle wafer section resistivity greater than 100 ohm•centimeters. An SOI insulator layer 22 is formed over the SOI substrate 20 and may have an SOI insulator layer thickness greater than 500 nanometers. The SOI insulator layer 22 may include Silicon Dioxide or other insulating material. An SOI device layer 24 is formed over the SOI insulator layer 22, and may have a SOI device layer thickness greater than 400 nanometers, a device section resistivity less than 10 ohm•centimeter, or both. Isolation of devices formed using the SOI device layer 24 may be affected by the thickness of the SOI insulator layer 22, the resistivity of the SOI handle wafer section 18, or both. A thicker SOI insulator layer 22 or a larger handle wafer resistivity may increase isolation; therefore, the SOI insulator layer thickness and the SOI handle wafer section resistivity can be traded off against each other. In one embodiment of the present invention, the SOI insulator layer thickness times the SOI handle wafer section resistivity may be greater than 50 ohm•centimeter$^2$.

Figure 3:
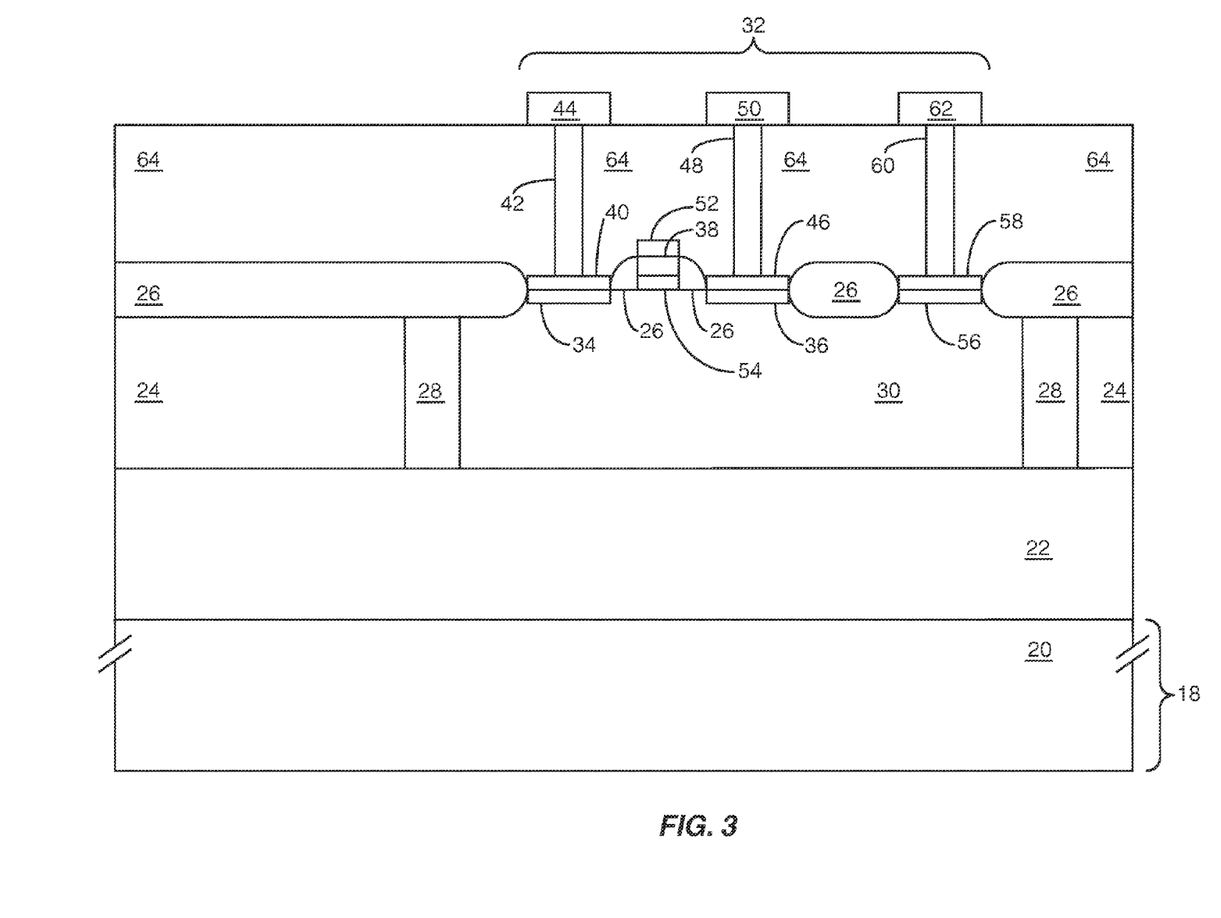
FIG. 3 shows a cross-section of a device that has been isolated using deep trench isolation and oxide filling according to one embodiment of the present invention.

FIG. 3 shows a cross-section of a device that has been isolated using deep trench isolation and oxide filling according to one embodiment of the present invention. Spacers 26 are formed into the SOI device layer 24 to provide isolation and protection. Isolation trenches 28 are etched into the SOI device layer 24 down to the SOI insulator layer 22 to isolate a device body 30. The device body 30 is an isolated silicon island, or well, which may be used to fabricate a metal oxide semiconductor field effect transistor (MOSFET) 32. Isolating the device body 30 from other devices is important for many RF applications, such as RF switches, as well as eliminating latch up between FETs in a CMOS technology. The body potential can still be controlled by the body terminal 62, which prevents floating body issues associated with some SOI technologies. The isolation trenches 28 are filled with oxide or other insulating material. Prior art solutions may use shallow trench isolation methods; however, the present invention uses deep trench isolation. The MOSFET 32 has a source 34 and a drain 36, which are formed using implantation of the device body 30, and a gate 38.

Source contact material 40 is connected to the source 34, a source metallic via 42 is connected to the source contact material 40, and a source metallic connection 44 is connected to the source metallic via 42. Drain contact material 46 is connected to the drain 36, a drain metallic via 48 is connected to the drain contact material 46, and a drain metallic connection 50 is connected to the drain metallic via 48. Gate contact material 52 is connected to the gate 38. Additional connections to the gate 38 are not shown in this section of the performance enhanced SOI wafer. Spacers 26 are located on either side of the gate 38 to provide isolation and to protect the channel of the MOSFET 32. Gate oxide 54 isolates the gate 38 from the device body 30. A body interface 56 is formed by implantation of the device body 30. Body contact material 58 is connected to the body interface 56, a body metallic via 60 is connected to the body contact material 58, and a body metallic connection 62 is connected to the body metallic via 60. The source, drain, and body contact materials 40, 46, 58 may be silicides, which are combinations of Silicon and metals. Dielectric material 64 fills in the remaining space between the spacers 26 and the metallic connections 44, 50, 62.

In one embodiment of the present invention, the source 34 and the drain 36 are N-type silicon, the gate 38 is N-type polysilicon, and the body contact 56 is P-type silicon. A floating body problem can exist when depletion regions below source 34 and drain 36 extend through the device body 30 down to the SOI insulator layer 22. In this case, the body of the FET below the gate 38 is not electrically connected to the body terminal 56. Since the body of the FET does not have a connection to a fixed potential, it may float to a higher or lower potential than expected, due to accumulation of positive or negative charges which are created in the FET during device operation. The accumulation of charge in the body of the FET may influence the electrical performance of the FET. By providing a thicker SOI device layer 24 and device body 30, the depletion regions may not reach the SOI insulator layer 22, which reduces or eliminates the floating body problem. In an alternate embodiment of the present invention, the source 34 and the drain 36 are P-type silicon, the gate 38 is P-type polysilicon, and the body contact 56 is N-type silicon. In alternate embodiments of the present invention, the gate oxide 54 may be omitted thereby providing a junction field effect transistor. The performance enhanced SOI wafer may provide multiple field effect transistor elements, which may be electrically isolated from each other. The multiple field effect transistor elements may be used in RF power amplifier circuitry, CMOS circuitry, RF switch circuitry, or any combination thereof. An RF switch may include multiple field effect transistor elements coupled in series.

Figure 4:
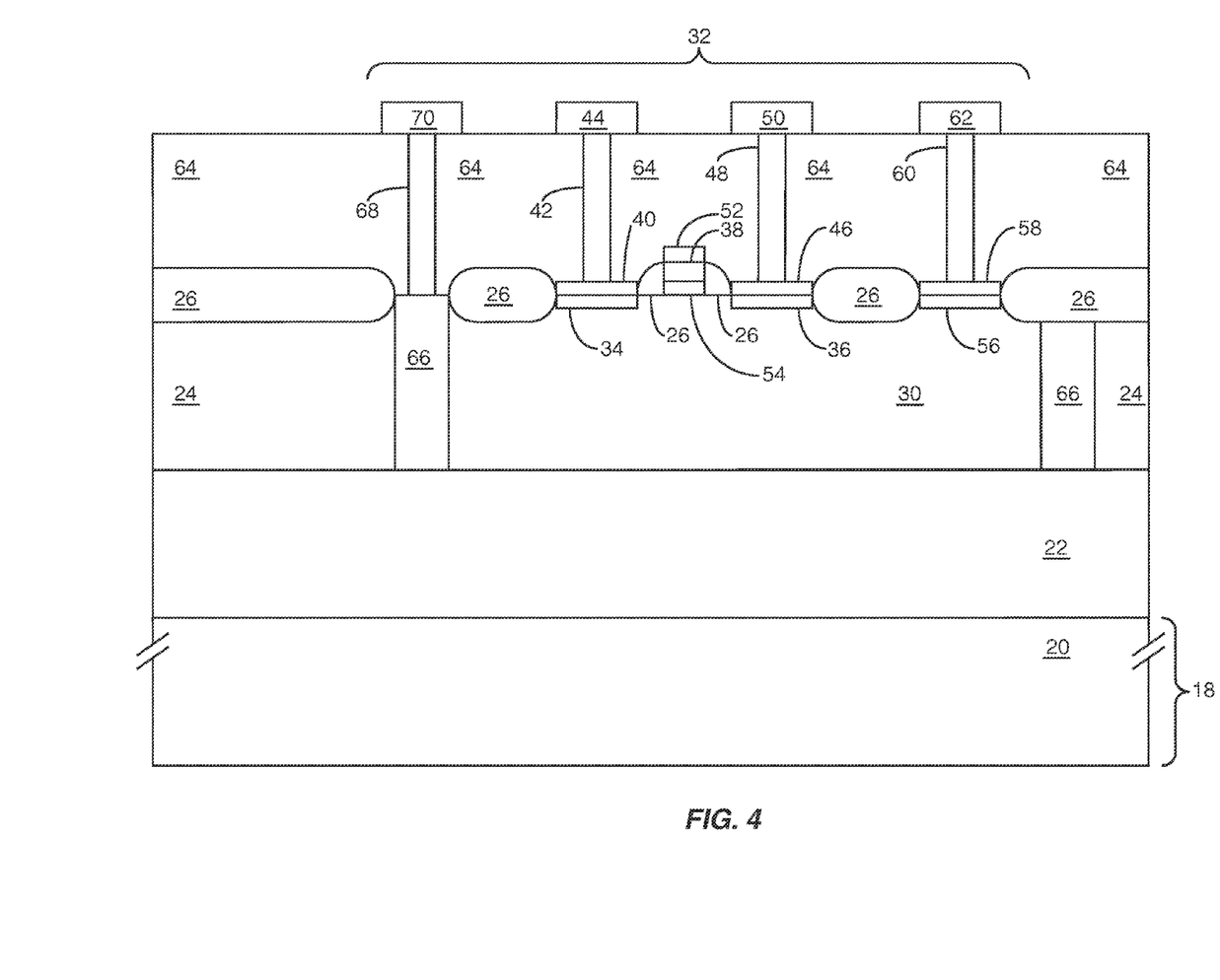
FIG. 4 shows a cross-section of a device that has been isolated using deep wall implant isolation according to an alternate embodiment of the present invention.

FIG. 4 shows a cross-section of a device that has been isolated using deep wall implant isolation according to an alternate embodiment of the present invention. The isolation trenches 28 illustrated in FIG. 3 have been replaced with isolation sidewalls 66, which are formed using an implanted material, such as Arsenic, Phosphorus, Boron, or any combination thereof. The isolation sidewalls 66 extend down to the SOI insulator layer 22, and may include N-type material to isolate P-type bodies (wells) or P-type material to isolate N-type bodies (wells). The isolation sidewalls 66 may be electrically biased with respect to the device body 30 to improve isolation. An implant metallic via 68 is coupled to the isolation sidewalls 66, and an implant metallic connection 70 is connected to the implant metallic via 68.

Figure 5:
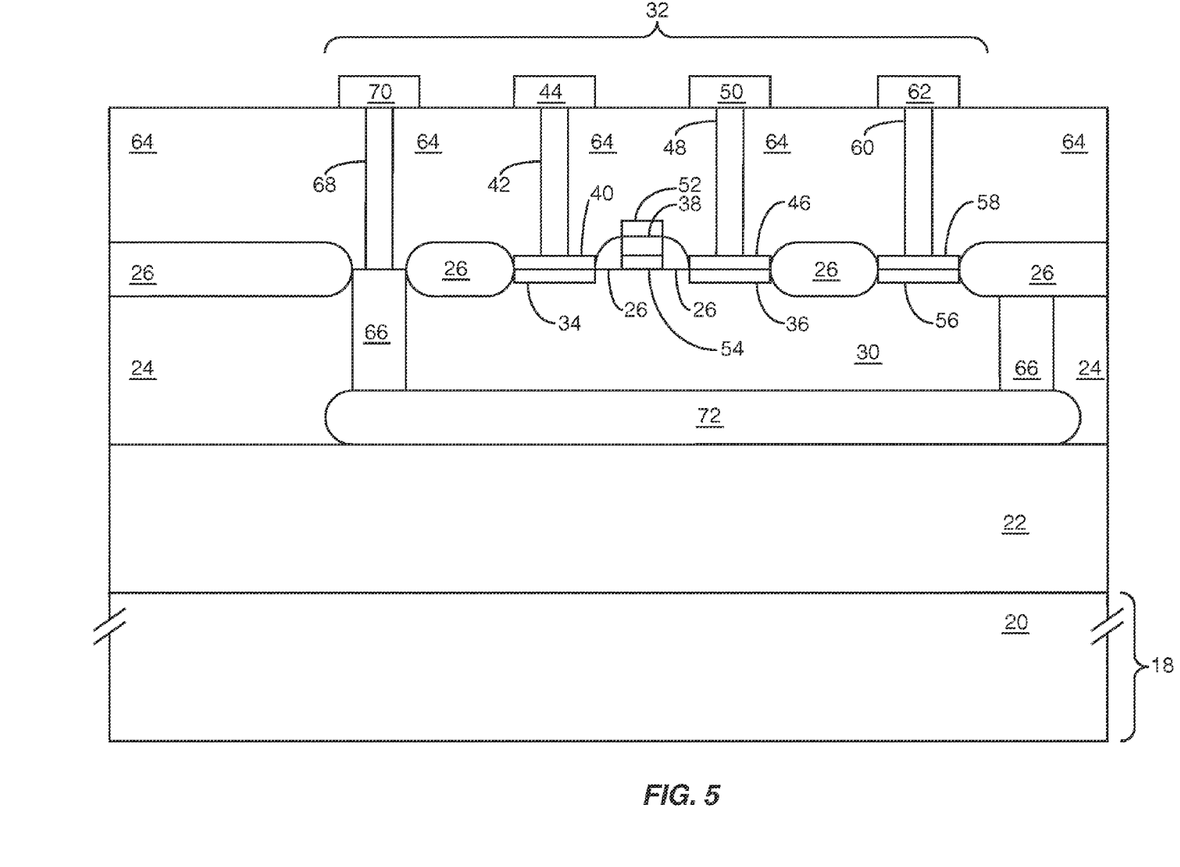
FIG. 5 shows a cross-section of a device that has been isolated using area and wall implant isolation according to an additional embodiment of the present invention.

FIG. 5 shows a cross-section of a device that has been isolated using area and wall implant isolation according to an additional embodiment of the present invention. Whereas the isolation sidewalls 66 illustrated in FIG. 4 were implanted down to the SOI insulator layer 22, the isolation sidewalls 66 illustrated in FIG. 5, are not implanted down to the SOI insulator layer 22. Instead, implant materials are used to create an isolation area 72, and the isolation sidewalls 66 are implanted down to the isolation area 72. The isolation sidewalls 66 and the isolation area 72 may be N-type material or P-type material requiring an electrical bias relative to the device body 30 for proper isolation.

Figure 6:
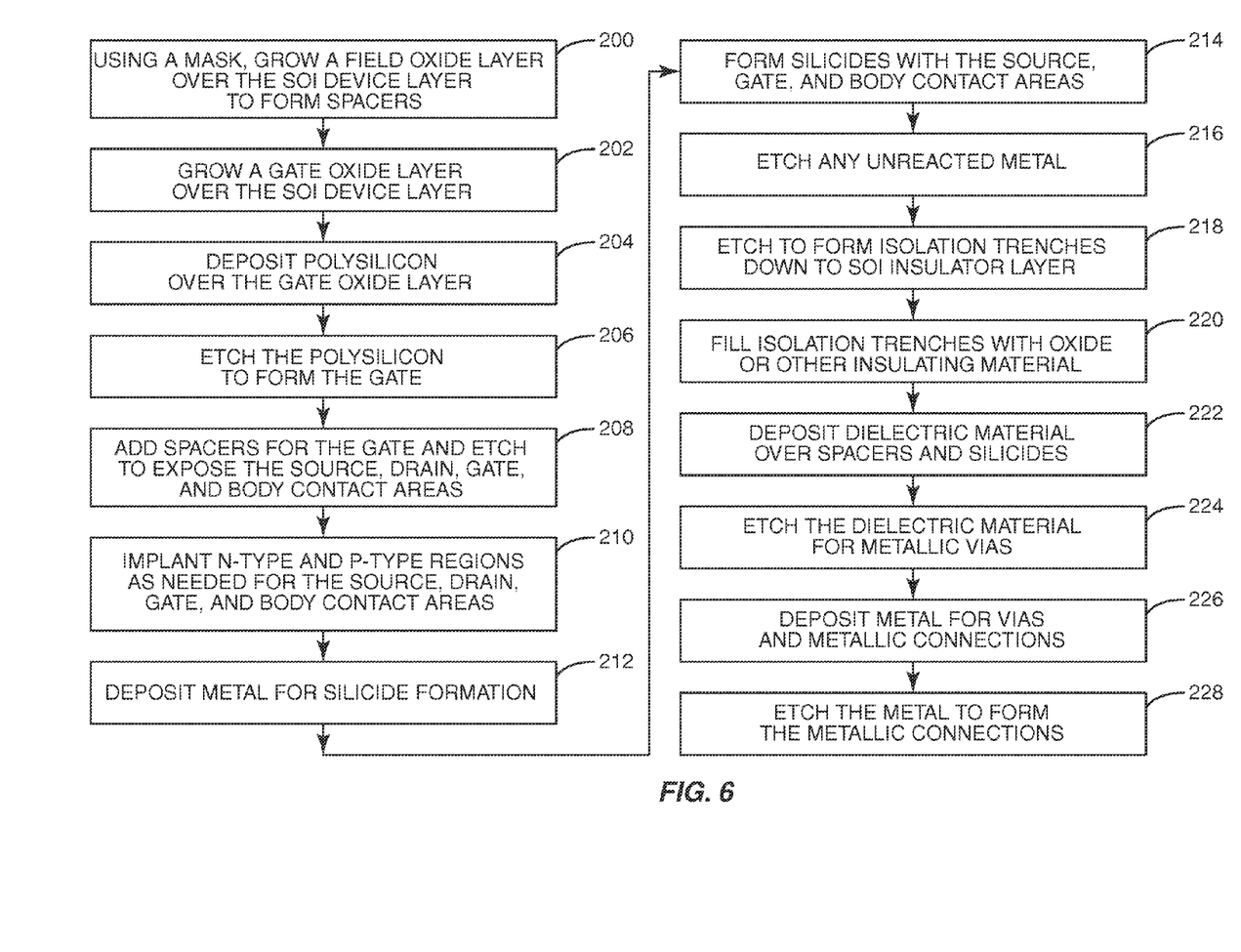
FIG. 6 illustrates a method for fabricating the device illustrated in FIG. 3.

FIG. 6 illustrates a method for fabricating the device illustrated in FIG. 3. First, using a mask, a field oxide layer is grown over the SOI device layer 24 to form the spacers 26 (Step 200). Then, a gate oxide layer is grown over the SOI device layer 24 (Step 202), polysilicon is deposited over the gate oxide layer (Step 204), and the polysilicon is etched to form the gate 38 (Step 206). Spacers 26 are added for the gate 38 and are etched to expose the source 34, the drain 36, the gate 38, and the body interface 56 contact areas (Step 208), N-type and P-type regions are implanted as needed for the source 34, the drain 36, the gate 38, and the body interface 56 contact areas (Step 210), metal is deposited for silicide formation (Step 212), and silicides 40, 46, 52, 58 are formed with the source 34, the drain 36, the gate 38, and the body interface 56 contact areas (Step 214). Any unreacted metal is etched (Step 216), the isolation trenches 28 are formed by etching down to the SOI insulator layer 22 (Step 218), and the isolation trenches 28 are filled with oxide or other insulating material (Step 220). Dielectric material 64 is then deposited over the spacers 26 and silicides 40, 46, 52, 58 (Step 222), the dielectric material 64 is etched for the metallic vias 42, 48, 60 (Step 224), metal is deposited for the vias 42, 48, 60 and the metallic connections 44, 50, 62 (Step 226), and the metal is etched to form the metallic connections 44, 50, 62 (Step 228).

In a first embodiment of the present invention, the SOI handle wafer section resistivity may be greater than 100 ohm•centimeters, the device section resistivity may be less than 10 ohm•centimeters, the SOI insulator layer thickness may be greater than 500 nanometers, the SOI device layer thickness may be greater than 400 nanometers, the SOI insulator layer thickness times the SOI handle wafer section resistivity may be greater than 50 ohm•centimeter$^2$, or any combination thereof.

In a second embodiment of the present invention, the SOI handle wafer section resistivity may be greater than 250 ohm•centimeters, the device section resistivity may be less than 25 ohm•centimeters, the SOI insulator layer thickness may be greater than 700 nanometers, the SOI device layer thickness may be greater than 500 nanometers, the SOI insulator layer thickness times the SOI handle wafer section resistivity may be greater than 100 ohm•centimeter$^2$, or any combination thereof.

In a third embodiment of the present invention, the SOI handle wafer section resistivity may be greater than 500 ohm•centimeters, the device section resistivity may be less than 50 ohm•centimeters, the SOI insulator layer thickness may be greater than 900 nanometers, the SOI device layer thickness may be greater than 700 nanometers, the SOI insulator layer thickness times the SOI handle wafer section resistivity may be greater than 200 ohm•centimeter$^2$, or any combination thereof.

In a fourth embodiment of the present invention, the SOI handle wafer section resistivity may be greater than 750 ohm•centimeters, the device section resistivity may be less than 75 ohm•centimeters, the SOI device layer thickness may be greater than 900 nanometers, the SOI insulator layer thickness times the SOI handle wafer section resistivity may be greater than 400 ohm•centimeter$^2$, or any combination thereof.

In a first exemplary embodiment of the present invention, the SOI handle wafer section resistivity may be approximately equal to 1000 ohm•centimeters, the device section resistivity may approximately equal to 10 ohm•centimeters, the SOI insulator layer thickness may be approximately equal to 1000 nanometers, the SOI device layer thickness may be approximately equal to 1000 nanometers, the SOI insulator layer thickness times the SOI handle wafer section resistivity may be approximately equal to 1000 ohm•centimeter$^2$, or any combination thereof. In a second exemplary embodiment of the present invention, the SOI handle wafer section resistivity may be approximately equal to 1400 ohm•centimeters.

Figure 7:
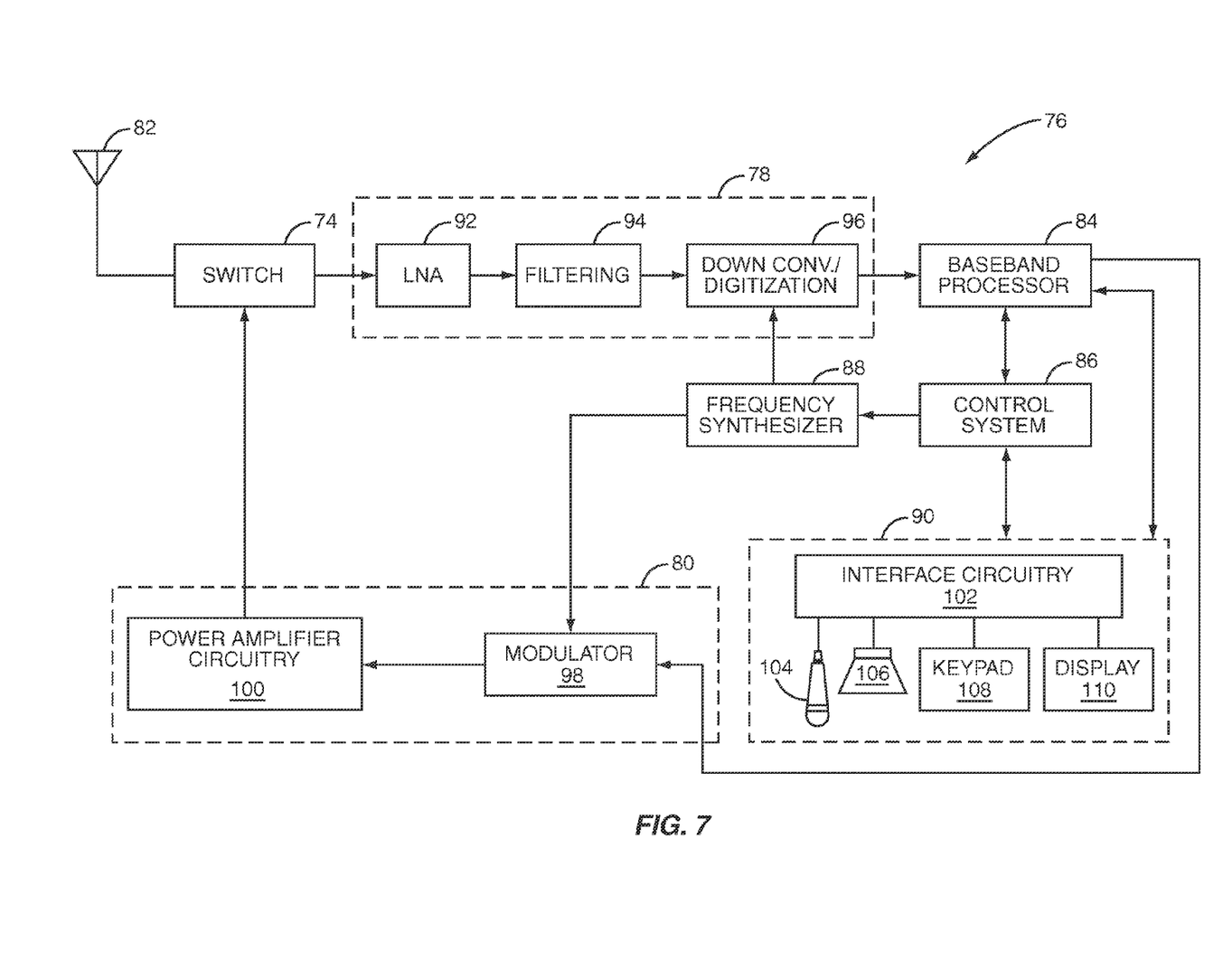
FIG. 7 shows an application example of the present invention used in a mobile terminal.

An application example of an RF switch 74 is its use in a mobile terminal 76, the basic architecture of which is represented in FIG. 7. The mobile terminal 76 may include a receiver front end 78, a radio frequency transmitter section 80, an antenna 82, the RF switch 74, a baseband processor 84, a control system 86, a frequency synthesizer 88, and an interface 90. The receiver front end 78 receives information bearing radio frequency signals from one or more remote transmitters provided by a base station (not shown). A low noise amplifier (LNA) 92 amplifies the signal. A filter circuit 94 minimizes broadband interference in the received signal, while down conversion and digitization circuitry 96 down converts the filtered, received signal to an intermediate or baseband frequency signal, which is then digitized into one or more digital streams. The receiver front end 78 typically uses one or more mixing frequencies generated by the frequency synthesizer 88. The baseband processor 84 processes the digitized received signal to extract the information or data bits conveyed in the received signal. This processing typically comprises demodulation, decoding, and error correction operations. As such, the baseband processor 84 is generally implemented in one or more digital signal processors (DSPs).

On the transmit side, the baseband processor 84 receives digitized data, which may represent voice, data, or control information, from the control system 86, which it encodes for transmission. The encoded data is output to the transmitter 80, where it is used by a modulator 98 to modulate a carrier signal that is at a desired transmit frequency. Power amplifier circuitry 100 amplifies the modulated carrier signal to a level appropriate for transmission, and delivers the amplified and modulated carrier signal to the antenna 82 through the RF switch 74.

A user may interact with the mobile terminal 76 via the interface 90, which may include interface circuitry 102 associated with a microphone 104, a speaker 106, a keypad 108, and a display 110. The interface circuitry 102 typically includes analog-to-digital converters, digital-to-analog converters, amplifiers, and the like. Additionally, it may include a voice encoder/decoder, in which case it may communicate directly with the baseband processor 84. The microphone 104 will typically convert audio input, such as the user's voice, into an electrical signal, which is then digitized and passed directly or indirectly to the baseband processor 84. Audio information encoded in the received signal is recovered by the baseband processor 84, and converted by the interface circuitry 102 into an analog signal suitable for driving the speaker 106. The keypad 108 and display 110 enable the user to interact with the mobile terminal 76, input numbers to be dialed, address book information, or the like, as well as monitor call progress information.

Those skilled in the art will recognize improvements and modifications to the preferred embodiments of the present invention. All such improvements and modifications are considered within the scope of the concepts disclosed herein and the claims that follow.

What is claimed is:

1. A silicon-on-insulator wafer comprising:
a silicon handle wafer section having a handle wafer section resistivity greater than about 100 ohm•centimeters;
an insulator layer over the handle wafer section having an insulator layer thickness greater than about 500 nanometers; and
a silicon device layer over the insulator layer comprising:
a first isolation area implanted into the silicon device layer over and approximately adjacent to the insulator layer,
a device body of a first field effect transistor (FET) over the first isolation area;
an FET source of the first FET substantially over the first FET device body;
an FET drain of the first FET substantially over the first FET device body; and
at least one isolation sidewall implanted into the silicon device layer down to the first isolation area to isolate the first FET,
wherein the silicon device layer has a silicon device layer thickness greater than about 400 nanometers.

2. The silicon-on-insulator wafer of claim 1 wherein the handle wafer section resistivity is greater than about 500 ohm•centimeters.

3. The silicon-on-insulator wafer of claim 1 wherein the insulator layer thickness is greater than about 700 nanometers.

4. The silicon-on-insulator wafer of claim 1 wherein the silicon device layer thickness is greater than about 500 nanometers.

5. The silicon-on-insulator wafer of claim 1 wherein a device section resistivity is less than about 25 ohm•centimeters.

6. The silicon-on-insulator wafer of claim 1 wherein the handle wafer section resistivity is approximately 1000 ohm•centimeters, a device section resistivity is approximately 10 ohm•centimeters, the insulator layer thickness is approximately 1000 nm, and the silicon device layer thickness is approximately 1000 nm.

7. The silicon-on-insulator wafer of claim 1 wherein the insulator layer comprises Silicon Dioxide.

8. The silicon-on-insulator wafer of claim 1 further comprising a plurality of FET elements.

9. The silicon-on-insulator wafer of claim 8 wherein one of the plurality of FET elements is electrically isolated from another of the plurality of FET elements.

10. The silicon-on-insulator wafer of claim 9 further comprising at least one isolation trench etched into the silicon device layer down to the insulator layer.

11. The silicon-on-insulator wafer of claim 10 wherein the at least one isolation trench is approximately filled with an oxide material.

12. The silicon-on-insulator wafer of claim 9 further comprising at least one isolation sidewall implanted into the silicon device layer down to the insulator layer.

13. The silicon-on-insulator wafer of claim 8 wherein the plurality of FET elements comprises a plurality of metal oxide semiconductor field effect transistor (MOSFET) elements.

14. The silicon-on-insulator wafer of claim 8 wherein a radio frequency power amplifier comprises certain of the plurality of FET elements.

15. The silicon-on-insulator wafer of claim 14 wherein complementary metal oxide semiconductor circuits comprise certain of the plurality of FET elements.

16. The silicon-on-insulator wafer of claim 8 wherein a radio frequency switch comprises certain of the plurality of FET elements.

17. The silicon-on-insulator wafer of claim 16 wherein complementary metal oxide semiconductor circuits comprise certain of the plurality of FET elements.

18. The silicon-on-insulator wafer of claim 16 wherein the certain of the plurality of FET elements are coupled in series.

* * * * *